United States Patent
Kuroyanagi

(10) Patent No.: US 9,509,276 B2
(45) Date of Patent: Nov. 29, 2016

(54) ACOUSTIC WAVE DEVICE AND METHOD OF FABRICATING THE SAME

(71) Applicant: TAIYO YUDEN CO., LTD., Tokyo (JP)

(72) Inventor: Takuma Kuroyanagi, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 291 days.

(21) Appl. No.: 14/102,363

(22) Filed: Dec. 10, 2013

(65) Prior Publication Data

US 2014/0210310 A1 Jul. 31, 2014

(30) Foreign Application Priority Data

Jan. 25, 2013 (JP) ................................. 2013-012150

(51) Int. Cl.
*H01L 41/047* (2006.01)
*H03H 9/10* (2006.01)

(52) U.S. Cl.
CPC .................. *H03H 9/1071* (2013.01)

(58) Field of Classification Search
CPC .. H03H 9/1021; H03H 9/131; H03H 9/1071; H03H 9/1092; H01L 41/053; H01L 41/047
USPC ....................... 310/313 R, 344, 348, 364, 365
See application file for complete search history.

(56) References Cited

U.S. PATENT DOCUMENTS

| | | | |
|---|---|---|---|
| 7,436,272 B2 * | 10/2008 | Fujii | H03H 3/02 310/348 |
| 2005/0034888 A1 | 2/2005 | Hoffmann et al. | |
| 2006/0012450 A1 | 1/2006 | Koga et al. | |
| 2007/0278903 A1 * | 12/2007 | Yamamoto | H03H 9/0552 310/348 |
| 2008/0122314 A1 * | 5/2008 | Yamashita | H03H 9/1092 310/313 R |
| 2008/0125662 A1 * | 5/2008 | Aikawa | H03H 3/08 600/463 |
| 2011/0018389 A1 * | 1/2011 | Fukano | H03H 9/059 310/313 R |
| 2011/0115339 A1 * | 5/2011 | Makibuchi | H01L 23/10 310/340 |
| 2012/0181898 A1 | 7/2012 | Hatakeyama et al. | |
| 2013/0134831 A1 * | 5/2013 | Yamashita | H01L 41/053 310/313 R |

FOREIGN PATENT DOCUMENTS

| | | |
|---|---|---|
| JP | 2003-188294 A | 7/2003 |
| JP | 2005-514846 A | 5/2005 |
| JP | 2006-50582 A | 2/2006 |
| JP | 2007-81555 A | 3/2007 |
| JP | 2008-135998 A | 6/2008 |
| JP | 2012-151698 A | 8/2012 |
| WO | 2009/157587 A1 | 12/2009 |

OTHER PUBLICATIONS

Japanese Office Action dated Oct. 11, 2016, in a counterpart Japanese patent application No. 2013-012150.

* cited by examiner

*Primary Examiner* — Shawki S Ismail
*Assistant Examiner* — Bryan Gordon
(74) *Attorney, Agent, or Firm* — Chen Yoshimura LLP

(57) ABSTRACT

An acoustic wave device includes: a substrate; a functional element formed on the substrate and including an excitation electrode that excites an acoustic wave; a columnar electrode formed on the substrate and electrically connected to the excitation electrode; a metal frame body formed on the substrate and surrounding the functional element and the columnar electrode; and a ceramic substrate sealing the functional element in combination with the metal frame body, a first metal layer bonded to the columnar electrode and a second metal layer bonded to the metal frame body being formed on a surface of the ceramic substrate.

7 Claims, 5 Drawing Sheets

ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2013-012150, filed on Jan. 25, 2013, the entire contents of which are incorporated herein by reference.

FIELD

A certain aspect of the present invention relates to an acoustic wave device and a method of fabricating the same.

BACKGROUND

There has been known acoustic wave devices including an acoustic wave filter using an acoustic wave such as a surface acoustic wave (SAW) or a bulk acoustic wave (BAW) as a filter for wireless devices including mobile phones. The acoustic wave device requires a structure to seal and protect a functional element for exciting the acoustic wave. For example, Japanese Patent Application Publication No. 2005-514846 discloses connecting an acoustic wave chip having an acoustic wave device formed therein to a support substrate by solder and hermetically sealing it by a resin.

The conventional acoustic wave device has been fabricated by separately performing a process of connecting a signal terminal on the acoustic wave chip to a terminal on a support substrate and a process of hermetically sealing the acoustic wave chip. Thus, the number of fabrication processes increases, and the production cost thus increases.

SUMMARY OF THE INVENTION

According to an aspect of the present invention, there is provided an acoustic wave device including: a substrate; a functional element formed on the substrate and including an excitation electrode that excites an acoustic wave; a columnar electrode formed on the substrate and electrically connected to the excitation electrode; a metal frame body formed on the substrate and surrounding the functional element and the columnar electrode; and a ceramic substrate sealing the functional element in combination with the metal frame body, a first metal layer bonded to the columnar electrode and a second metal layer bonded to the metal frame body being formed on a surface of the ceramic substrate.

According to another aspect of the present invention, there is provided a method of fabricating an acoustic wave device, the method including: forming a functional element including an excitation electrode that excites an acoustic wave on a substrate, simultaneously forming a columnar electrode electrically connected to the excitation electrode and a metal frame body surrounding the functional element and the columnar electrode on the substrate; sealing the functional element by stacking a ceramic substrate on the columnar electrode and the metal frame body so that a first metal layer formed on the ceramic substrate is stacked on the columnar electrode to form a terminal portion and a second metal layer formed on the ceramic substrate is stacked on the metal frame body to form a sealing portion.

DETAILED DESCRIPTION

A description will first be given of an acoustic wave device in accordance with a comparative example.

Figure 1:
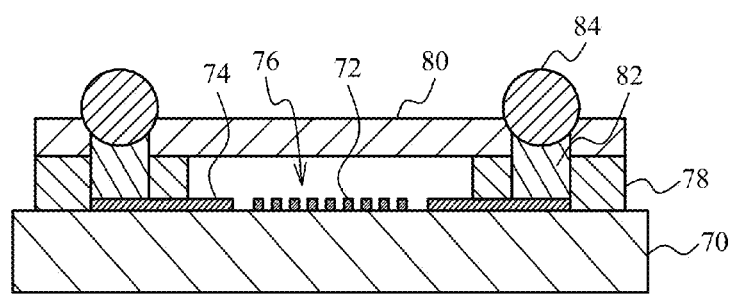
FIG. 1 is a diagram illustrating a structure of an acoustic wave device in accordance with a comparative example.

FIG. 1 is a diagram illustrating a structure of an acoustic wave device in accordance with the comparative example. An IDT 72 and a wiring 74 electrically connected to the IDT 72 are formed on a piezoelectric substrate 70. A hollow space is located above the IDT 72, and a functional element 76 to excite an acoustic wave is formed. A side wall 78 made of a resin is formed around the functional element 76, and a lid body 80 made of a resin is formed on the side wall 78. The side wall 78 and the lid body 80 seal and protect the functional element 76 of the acoustic wave device. In addition, columnar electrodes 82 piercing through the side wall 78 and the lid body 80 are formed on the wiring 74. Furthermore, a solder ball 84 is formed at the tip of the columnar electrode 82.

The piezoelectric substrate 70 is made of a piezoelectric substance such as lithium tantalate ($LiTaO_3$) or lithium niobate ($LiNbO_3$) with a thickness of, for example, 250 μm. The side wall 78 is formed so as to have a height of 30 μm by using, for example, a liquid resist, and the lid body 80 is formed so as to have a thickness of 45 μm by using, for example, a film resist.

The acoustic wave device of the comparative example can be electrically connected to an outside by the columnar electrodes 82 and the solder balls 84 electrically connected to the wiring 74 (the signal terminal and the ground terminal of the IDT 72 are extracted to the outside through the wiring 74). When flip-chip mounted on the support substrate (not illustrated) with the solder ball 84 facing downward, the acoustic wave device can be fixed to the support substrate and electrically connected to the support substrate.

However, in the acoustic wave device of the comparative example, separately performed are a process of sealing the functional element 76 of the acoustic wave device (a process of forming the side wall 78 and the lid body 80) and a process of establishing electrical connection with an outside (a process of forming the columnar electrodes 82 and the solder balls 84). Therefore, the number of processes increases, and the production cost thus increases. In addition, the sealing with a resin deteriorates moisture resistance, heat release performance, and power durability compared to the sealing with a ceramic substrate described later.

To solve the above-described problems, the following embodiment describes an acoustic wave device and a fabrication method thereof that streamline the fabrication process and increase the reliability.

First Embodiment

Figure 2A:
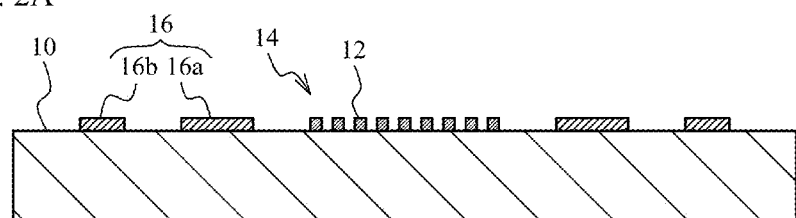
FIG. 2A through FIG. 2D are diagrams illustrating a method of fabricating an acoustic wave device in accordance with a first embodiment (No. 1)

FIG. 2A through FIG. 3D are diagrams illustrating a method of fabricating an acoustic wave device in accordance with a first embodiment. As illustrated in FIG. 2A, a functional element 14 including an IDT (InterDigital Transducer) 12 and reflection electrodes (not illustrated) and a lower metal layer 16 are first formed on a piezoelectric substrate 10. A portion indicated by a reference numeral 16a of the lower metal layer 16 forms a part of a columnar electrode (reference numeral 30 in FIG. 4A) for transmitting a signal from the functional element 14 to an outside, and may have, for example, a circular cross-sectional shape. In addition, a portion indicated by a reference numeral 16b of the lower metal layer 16 forms a part of a metal frame body (reference numeral 32 in FIG. 4A) for sealing the functional element 14. The lower metal layer 16b is formed so as to surround the functional element 14 and the lower metal layer 16a.

The piezoelectric substrate 10 may be made of a piezoelectric substance such as lithium tantalate ($LiTaO_3$) or lithium niobate ($LiNbO_3$) with a thickness of 180 μm. In addition, the IDT 12 and the lower metal layer 16 may be made of, for example, aluminum (Al) or copper (Cu).

Figure 2B:
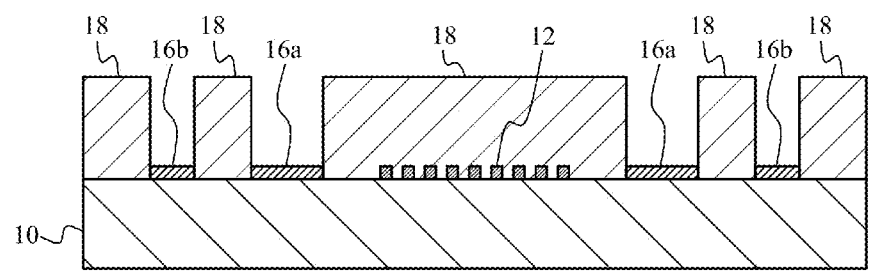
Figure 2C:
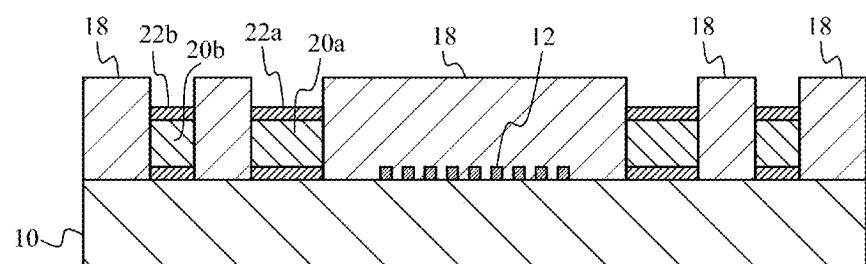

As illustrated in FIG. 2B, a resist 18 is then formed in regions of the surface of the piezoelectric substrate 10 in which the lower metal layer 16 is not formed (including the region above the IDT 12). As illustrated in FIG. 2C, a middle metal layer 20 is then formed on the lower metal layer 16 exposed from the resist 18. A portion indicated by a reference numeral 20a of the middle metal layer 20 forms a part of the columnar electrode 30 described previously, and a portion indicated by a reference numeral 20b forms a part of the metal frame body 32. The middle metal layer 20 may be formed by, for example, electrolytic plating, and may have a total thickness of 20 μm in combination with the lower metal layer 16.

Figure 2D:
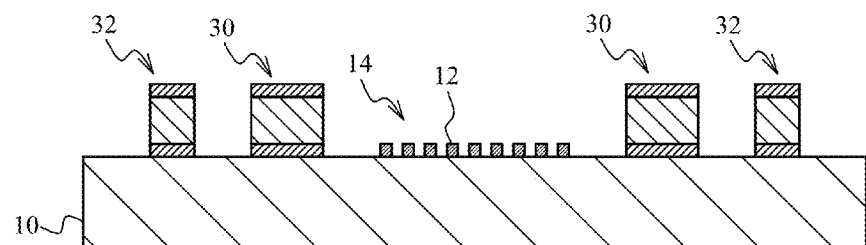

As illustrated in FIG. 2C, an upper metal layer 22 is then formed on the middle metal layer 20 exposed from the resist 18. The upper metal layer 22 is a layer to provide a connection with a metal layer on a ceramic substrate 40 described later, and may be made of, for example, solder (SnAg) with a thickness of 10 μm. A portion indicated by a reference numeral 22a of the upper metal layer 22 forms a part of the columnar electrode 30 described previously, and a portion indicated by a reference numeral 22b forms a part of the metal frame body 32 described previously. As illustrated in FIG. 2D, the resist 18 is then removed. The fabrication process for the piezoelectric substrate 10 side is completed through the above-described processes.

Figure 3A:
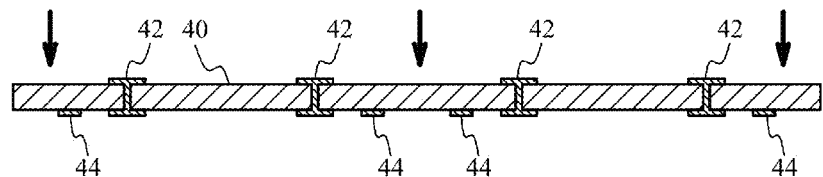
FIG. 3A through FIG. 3D are diagrams illustrating the method of fabricating the acoustic wave device in accordance with the first embodiment (No. 2)

Then, as illustrated in FIG. 3A, prepared is the ceramic substrate 40 including a metal layer formed on the surface thereof. The metal layer formed on the ceramic substrate 40 includes terminal portions 42 (first metal layer) to be bonded to the columnar electrodes 30 on the piezoelectric substrate 10, and sealing portions 44 (second metal layer) to be bonded to the metal frame bodies 32 on the piezoelectric substrate 10. The terminal portions 42 (first metal layer) are extracted to the opposite side to the ceramic substrate 40 through penetration holes formed in the ceramic substrate 40. The sealing portions 44 are circularly formed at positions corresponding to the positions of the metal frame bodies 32 on the piezoelectric substrate 10 so as to surround the terminal portions 42.

The ceramic substrate 40 may have a thickness of, for example, 90 μm. The terminal portions 42 and the sealing portions 44 may be made of a metal layer formed by stacking tungsten (W), nickel (Ni), and gold (Au) in this order from the ceramic substrate 40 side, and may have a thickness of, for example, 10 μm. Thus, the ceramic substrate 40 including the metal layer has a thickness of, for example, 110 μm.

Figure 3B:
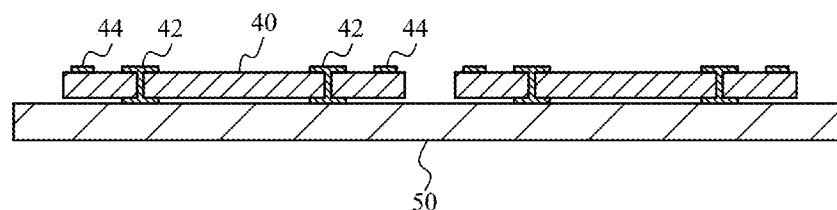

Then, as illustrated in FIG. 3B, the ceramic substrate 40 is cut into individual ceramic substrates 40, and the surfaces opposite to the surfaces on which the sealing portion 44 is formed are attached to a heat-resistant tape 50. At this point, the individual ceramic substrates 40 are attached at positions corresponding to positions of individual piezoelectric substrates 10 in a wafer state. The heat-resistant tape 50 may be, for example, a polyimide tape.

Figure 3C:
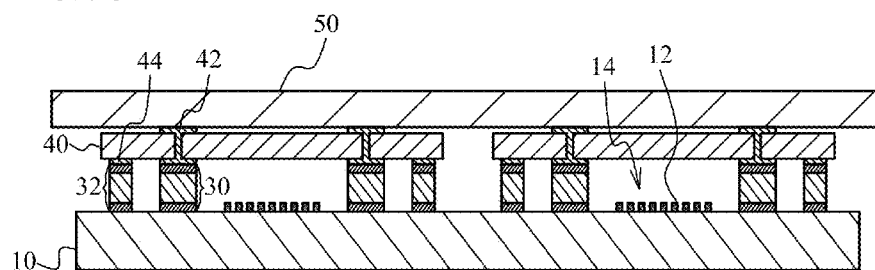

Then, as illustrated in FIG. 3C, the heat-resistant tape 50 to which the individual ceramic substrates 40 are attached is attached to the surface of the piezoelectric substrate 10 from the side at which the ceramic substrate 40 is formed. At this point, the terminal portions 42 make contact with the upper metal layers 22a on the columnar electrodes 30, and the sealing portions 44 make contact with the upper metal layers 22b on the metal frame bodies 32. Then, the ceramic substrate 40 is heated to a temperature higher than the melting point of solder (260° C.) and pressurized to bond the aforementioned metal layers to each other, and the sealing is completed.

Figure 3D:
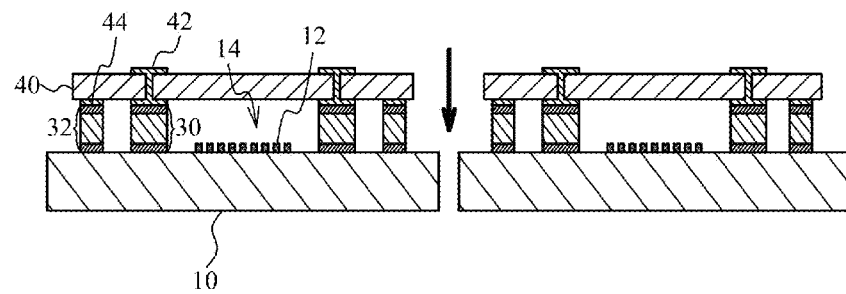

Then, as illustrated in FIG. 3D, the heat-resistant tape is removed, and the piezoelectric substrate 10 is cut to be separated into individual devices. The acoustic wave device of the first embodiment is completed through the above-described processes.

Figure 4A:
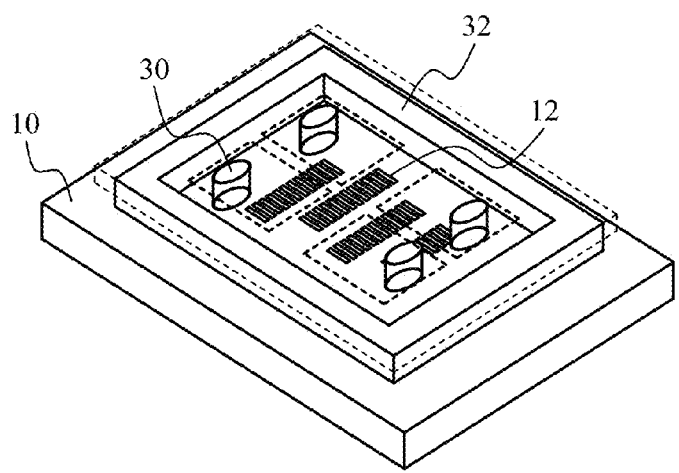
FIG. 4A and FIG. 4B are diagrams illustrating a structure of the acoustic wave device in accordance with the first embodiment.
Figure 4B:
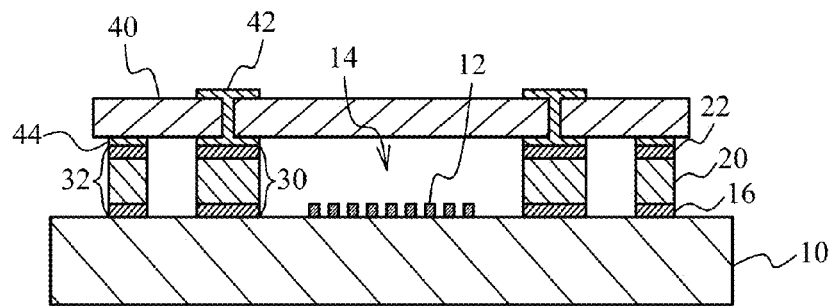

FIG. 4A and FIG. 4B are diagrams illustrating a structure of an acoustic wave device 100 of the first embodiment. FIG. 4A is a perspective view illustrating the ceramic substrate 40 transparently (illustrating the ceramic substrate 40 and the terminal portions 42 with dotted lines), and FIG. 4B illustrates a cross-sectional view of the overall structure. As illustrated in FIG. 4A and FIG. 4B, the columnar electrodes 30 and the metal frame body 32 are formed on the piezoelectric substrate 10. The columnar electrodes 30 are electrically connected to the IDT 12 on the piezoelectric substrate 10 and the terminal portions 42 on the ceramic substrate 40. As illustrated in FIG. 4B, the terminal portions 42 are extracted to the upper surface side of the ceramic substrate 40 (the opposite side to the functional element 14), and thus the terminal portions 42 can electrically connect the acoustic wave device 100 to the outside.

Figure 5A:
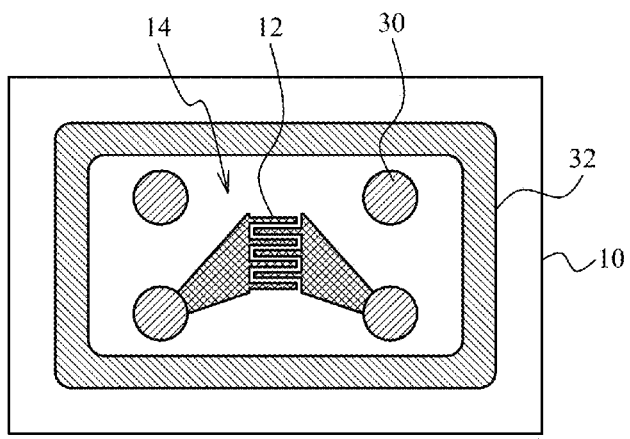
FIG. 5A through FIG. 5C are diagrams illustrating a structure of a sealing portion of the acoustic wave device of the first embodiment.
Figure 5B:
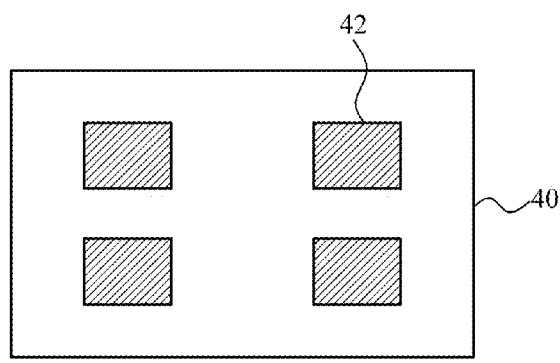
Figure 5C:
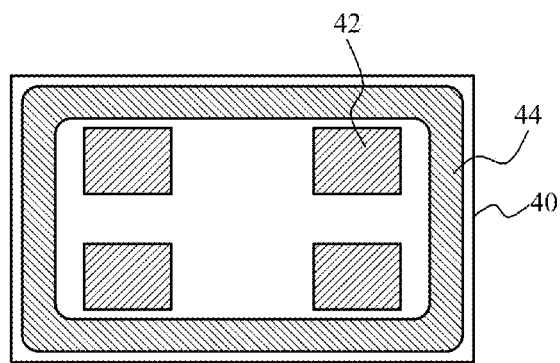

FIG. 5A through FIG. 5C are plan views illustrating a detail of a sealing structure. FIG. 5A is a top view of the piezoelectric substrate 10, FIG. 5B illustrates a structure at the upper surface side of the ceramic substrate 40, and FIG. 5C illustrates a structure at the lower surface side of the ceramic substrate 40 (the functional element 14 side). As illustrated in FIG. 5A, the metal frame body 32 is formed so as to surround the IDT 12 and the columnar electrodes 30. In addition, as illustrated in FIG. 5A and FIG. 5B, the cross-sectional shape of the columnar electrode 30 is a circle, and the cross-sectional shape of the terminal portion 42 is a rectangle, but may have other shapes. In addition, as illustrated in FIG. 5A and FIG. 5C, the metal frame body 32 and the sealing portion 44 are formed at positions overlapping with each other. In the present embodiment, the ceramic substrate 40 is smaller than the piezoelectric substrate 10 when viewed from the vertical direction (the penetrating direction of the piezoelectric substrate 10) Thus, the distance between the outer peripheral portion of the ceramic substrate 40 and the sealing portion 44 is smaller than the distance between the outer peripheral portion of the piezoelectric substrate 10 and the metal frame body 32.

In the acoustic wave device 100 of the first embodiment, the sealing is performed by stacking the ceramic substrate 40, on which the terminal portions 42 and the sealing portion 44 are preliminarily formed, on the columnar electrodes 30 and the metal frame body 32 formed on the piezoelectric substrate 10. Therefore, the process of sealing the functional element of the acoustic wave device 100 and the process of establishing the electrical connection with the outside can be simultaneously performed. Thus, the number of fabrication processes can be reduced.

In addition, the acoustic wave device 100 of the first embodiment uses a metal frame body made of a metal for a side wall for sealing, and uses the ceramic substrate 40 for a lid body for sealing. This enables to obtain an acoustic wave device having moisture resistance, heat release performance, and power durability better than those of the comparative example that uses a resin for sealing. As described above, the first embodiment can streamline the fabrication process and obtain the acoustic wave device of which the reliability is improved.

In addition, the acoustic wave device of the first embodiment is formed by cutting the ceramic substrate 40 and then attached to the heat-resistant tape 50 before sealing (FIG. 3A to FIG. 3C). The ceramic substrate 40 is baked after the metal pattern (the terminal portions 42 and the sealing portion 44) is formed, and thus the shape thereof becomes a non-linear shape due to the shrinkage when baked. Thus, the sealing is stably performed by separating the ceramic substrate 40 into individual ceramic substrates 40 and then attaching each of them to the heat-resistant tape (support medium) at a position corresponding to the position of the piezoelectric substrate 10 to be sealed.

In addition, in the acoustic wave device of the first embodiment, the columnar electrode 30 has a height same as that of the metal frame body 32. This enables to simultaneously perform the sealing and the establishment of the electrical connection with the outside only by stacking the ceramic substrate 40 in the sealing process (FIG. 3C).

In addition, in the acoustic wave device of the first embodiment, the sealing can be performed by using the ceramic substrate 40 smaller than the piezoelectric substrate 10 (FIG. 5). This enables to downsize the device.

The first embodiment describes a resonator using a surface acoustic wave (SAW) as an acoustic wave device, but the acoustic wave device may be a film bulk acoustic resonator (FBAR) using a bulk acoustic wave or an acoustic wave device using a Love wave, a boundary wave, or a Lamb wave. These acoustic wave devices also have a functional element to excite the acoustic wave as with the acoustic wave device of the first embodiment, and the method of the first embodiment is preferably used to seal the functional element. The first embodiment describes a case where the piezoelectric substrate 10 is used, but a substrate other than a piezoelectric substrate may be used when an acoustic wave device other than the SAW resonator is used.

Although the embodiments of the present invention have been described in detail, it is to be understood that the various change, substitutions, and alterations could be made hereto without departing from the spirit and scope of the invention.

What is claimed is:

1. An acoustic wave device comprising:
   a substrate;
   a functional element formed on the substrate and including an excitation electrode that excites an acoustic wave;
   a columnar electrode formed on the substrate and electrically connected to the excitation electrode;
   a metal frame body formed on the substrate and surrounding the functional element and the columnar electrode in a plan view and electrically isolated from the columnar electrode; and
   a ceramic substrate sealing the functional element in combination with the metal frame body, a first metal layer bonded to the columnar electrode and a second metal layer bonded to the metal frame body being formed on a surface of the ceramic substrate, the first metal layer being located between the columnar electrode and the ceramic substrate, the second metal layer being located between the metal frame body and the ceramic substrate.

2. The acoustic wave device according to claim 1, wherein the first metal layer is extracted to an opposite side to the ceramic substrate through a penetration hole formed in the ceramic substrate.

3. The acoustic wave device according to claim 1, wherein the substrate is a piezoelectric substrate, and
   the ceramic substrate is smaller than the piezoelectric substrate when viewed from a penetrating direction of the substrate.

4. The acoustic wave device according to claim 1, wherein the metal frame body has a thickness same as a thickness of the columnar electrode.

5. The acoustic wave device according to claim 1, wherein the ceramic substrate does not include resin.

6. The acoustic wave device according to claim 2, wherein the penetration hole is smaller than the columnar electrode in the plan view.

7. The acoustic wave device according to claim 4, wherein the metal frame body is made of same material as the columnar electrode.

* * * * *